US 9,263,610 B2

(12) United States Patent
Lau et al.

(10) Patent No.: US 9,263,610 B2
(45) Date of Patent: Feb. 16, 2016

(54) ELECTROCHEMICAL METHOD OF PRODUCING COPPER INDIUM GALLIUM DISELENIDE (CIGS) SOLAR CELLS

(75) Inventors: Leo Lau, Hong Kong (CN); Zhifeng Ding, London (CA); David Anthony Love, Arillia (CA); Mohammad Harati, London (CA); Jun Yang, London (CA)

(73) Assignee: CHENGDU ARK ETERNITY PHOTOVOLTAIC TECHNOLOGY COMPANY LIMITED, Shuangliu, Chengdu (CN)

( * ) Notice: Subject to any disclaimer, the term of this patent is extended or adjusted under 35 U.S.C. 154(b) by 713 days.

(21) Appl. No.: 13/395,022

(22) PCT Filed: Sep. 8, 2010

(86) PCT No.: PCT/CA2010/001421
§ 371 (c)(1),
(2), (4) Date: May 17, 2012

(87) PCT Pub. No.: WO2011/029197
PCT Pub. Date: Mar. 17, 2011

(65) Prior Publication Data
US 2012/0227811 A1 Sep. 13, 2012

Related U.S. Application Data

(60) Provisional application No. 61/240,551, filed on Sep. 8, 2009.

(51) Int. Cl.
*C25D 5/18* (2006.01)
*C25D 7/12* (2006.01)
(Continued)

(52) U.S. Cl.
CPC .......... *H01L 31/0322* (2013.01); *C04B 35/547* (2013.01); *C25D 3/665* (2013.01);
(Continued)

(58) Field of Classification Search
CPC ............. C25D 3/665; C25D 3/66; C25D 7/12
USPC ........................................................ 205/232
See application file for complete search history.

(56) References Cited

U.S. PATENT DOCUMENTS 4,883,567 A * 11/1989 Verbrugge et al. ............ 205/232
5,804,054 A 9/1998 Bhattacharya
(Continued)

FOREIGN PATENT DOCUMENTS

CN 1155111 C 6/2004
CN 1844478 A 10/2006
(Continued)

OTHER PUBLICATIONS

El Abedin et al "Electrodeposition of selenium, indium and copper in an air- and water-stable ionic liquid at variable temperatures" Electrochimica Acta, 2007, p. 2746-2754.*
(Continued)

*Primary Examiner* — Nicholas A Smith
*Assistant Examiner* — Brian W Cohen
(74) *Attorney, Agent, or Firm* — Hill & Schumacher; Lynn C. Schumacher

(57) ABSTRACT

The present invention describes a method of producing a photovoltaic solar cell with stoichiometric p-type copper indium gallium diselenide ($CuIn_xGa_{1-x}Se_2$) (abbreviated CIGS) as its absorber layer and II-IV semiconductor layers as the n-type layers with electrodeposition of all these layers. The method comprises a sequence of novel procedures and electrodeposition conditions with an ionic liquid approach to overcome the technical challenges in the field for low-cost and large-area production of CIGS solar cells with the following innovative advantages over the prior art: (a) low-cost and large-area electrodeposition of CIGS in one pot with no requirement of post-deposition thermal sintering or selenization; (b) low-cost and large-area electrodeposition of n-type II-VI semiconductors for the completion of the CIGS solar cell production; and (c) low-cost and large-area deposition of a buffer layer of CdS or other compounds with a simple chemical bath method.

42 Claims, 2 Drawing Sheets

(51) Int. Cl.
*H01L 31/032* (2006.01)
*C04B 35/547* (2006.01)
*H01L 31/0392* (2006.01)
*H01L 31/0749* (2012.01)
*C25D 3/66* (2006.01)

(52) U.S. Cl.
CPC ............ *C25D 7/12* (2013.01); *H01L 31/0392* (2013.01); *H01L 31/0749* (2013.01); *C04B 2235/3281* (2013.01); *C04B 2235/3286* (2013.01); *C25D 3/66* (2013.01); *C25D 5/18* (2013.01); *Y02E 10/541* (2013.01)

(56) References Cited

U.S. PATENT DOCUMENTS

| | | |
|---|---|---|
| 7,122,398 B1 | 10/2006 | Pichier |
| 7,297,868 B2 | 11/2007 | Bhattacharya |
| 2004/0206390 A1 | 10/2004 | Bhattacharya |

FOREIGN PATENT DOCUMENTS

| | | |
|---|---|---|
| CN | 101017855 A | 8/2007 |
| CN | 101079454 A | 11/2007 |
| CN | 101313411 A | 11/2008 |

OTHER PUBLICATIONS

Lincot et al, "Chalcopyrite thin film solar cells by electrodeposition", Solar Energy, vol. 77, Issue 6, Dec. 2004, pp. 725-737.
Lai et al, "Cyclic voltammetry study of electrdeposition of Cu(In,Ga)Se2 thin films", Electochimica Acta, vol. 54, Issue 11, Apr. 15, 2009, pp. 3004-3010 Available online Dec. 24, 2008, abstract.
Friedfeld et al, "Electrodeposition of CuInxGa1-xSe2 thin films", Solar Energy Materials and Solar Cells, Voume 58, Issue 4, Aug. 1999, pp. 375-385, abstract.
Shivagan et al, "Electrodeposition of chalcopyrite films from ionic liquid electrolytes", Thin and Solid Films, 515, (2007) pp. 5899-5903, available online Jan. 23, 2007.
Yun Sun, et al. Research on CIS and CIGS Thin Film Solar Cells, Acta Energiae Solaris Sinica, vol. 22, No. 2, pp. 192-195 Apr. 2001.

* cited by examiner

ELECTROCHEMICAL METHOD OF PRODUCING COPPER INDIUM GALLIUM DISELENIDE (CIGS) SOLAR CELLS

CROSS REFERENCE TO RELATED US APPLICATIONS

This patent application is a National Phase application claiming the benefit of PCT/CA2010/001421 filed on Sep. 8, 2010, in English, which further claims the priority benefit of United States provisional patent application Ser. No. 61/240, 551 filed on Sep. 8, 2009, entitled ELECTROCHEMICAL METHOD OF PRODUCING COPPER INDIUM GALLIUM DISELENIDE (CIGS) SOLAR CELLS, all of which are incorporated herein by reference in their entirety.

FIELD OF THE INVENTION

The present invention is related to methods of production of copper indium gallium diselenide ($CuIn_xGa_{1-x}Se_2$) (abbreviated CIGS) films and the production of photovoltaic solar cells using these CIGS films as the p-type semiconductor and either II-VI layers or organic semiconductors as the n-type semiconductors. The method involves producing these layers in a sequence of one-pot bath based processes. The present method provides a low cost way electrochemical method of producing large area CIGS films from ionic liquids.

BACKGROUND OF THE INVENTION

While the sunlight incident on the earth has significant potential to match our total world oil reserve of ~3 trillion barrels with 1.5 days of irradiation, the solar approach currently supplies only 0.015% of electricity globally. The bottleneck in the adoption of large scale solar to electrical energy conversion is the low efficiency of the photovoltaic (PV) conversion and high manufacturing cost of solar cells. All of these undesirably stall the lowering of solar cell prices from its current level of >$0.3-4/kW-hr to the market acceptance level of ~$0.1/kW-hr. The bottom line is that the solar-panel production cost has to be significantly less than the current cost of about $1/W. With the technology advancement in the production of low-cost and large-area solar cells, novel applications such as wearable solar cells fabricated on polymer or other flexible materials will further expand the solar cell market well beyond that presently envisaged.

Among many solar absorbing semiconducting materials, the absorption spectrum of copper indium gallium diselenide (CIGS) thin films matches the solar spectrum when the stoichiometry of $Cu(In_xGa_{1-x})Se_2$, with x ranging about 0.6 to 0.8, is reached. They have great potentials to reach very high PV conversion in solar cells because of this behaviour. CIGS will therefore play a vital role in solar cell production. In fact, conversion efficiencies of ~20% has already been demonstrated with CIGS thin film solar cells in research laboratories. Following the prevalent technology in producing compound semiconductors for optoelectronics in the current market, nearly all global players in CIGS business produce CIGS by the high vacuum techniques of evaporation or sputtering. However, both the capital and operation costs involved in these methods of fabrication are high, the throughput is limited and is not conducive to size-scalable production as would be required for efficient commercialization of these films due to the limited size of the vacuum chambers used for depositing these films.

Another technical problem is the control of the formation of stoichiometric CIGS films and proper grain properties in these films required for this material to be useful in large scale solar cell applications. Due to the relatively high vapor pressure of selenium even in a moderately elevated temperature, as-deposited CIGS films often do not have the optimum amount of selenium. The prevalent approach to circumvent the problem is to sinter as-deposited CIGS films in the presence of a selenium vapor at a temperature in the range of 300-600° C. Although the films can be fed continuously into a space-optimized sintering chamber for throughput improvement and cost reduction, this post-deposition treatment is still an extra manufacturing step requiring vacuum technology, thermal and electrical energy, and comprehensive safety procedures due to the presence of very toxic selenium vapor. More importantly, the adoption of thermal sintering at >300° C. forfeits the opportunity of producing solar cells directly on polymers and many other potentially desirable materials.

To meet the market-driven technology requirement of efficient, economical and practical large-area production of rolls of CIGS films for CIGS solar cell fabrication, Nanosolar Inc. pioneered an ink-jet printing technology of CIGS film formation (see, e.g., U.S. Pat. No. 7,122,398 issued to K. Pichler and references cited therein). In this method, nano-particles of CIGS are chemically synthesized and suspended in a colloidal liquid (commonly referred to as a "nano-CIGS ink") with a suitable surfactant present on the surface of each nano-particle to prevent aggregation of the particles, and with other chemical additives being present that are required for the ink-printing process. The nano-CIGS ink is then be printed and a CIGS film is formed by heat treatment of the printed CIGS film to remove the solvent, surfactant, and other chemical additives, and to sinter the nano-CIGS particles into a coherent film.

U.S. Pat. No. 7,122,398 issued to Pichler discloses that after this thermal treatment step, "the film may optionally be exposed to selenium vapor at about 300-500° C. for about 30-45 minutes to ensure the proper stoichiometry of Se in the film". It is well known in the field that such a selenization thermal treatment also improves the grain properties and electrical properties of CIGS films (see, e.g., N. Naghavi et al., Progress in Photovoltaics: Research and Applications, 2009, 17, 1-9). Hence, the technology requirement of a low-cost and large-area deposition of stoichiometric CIGS films with no requirement of any post-deposition heat treatment has not yet been fulfilled.

While it is well known that many electrically conductive materials can be deposited in a large area at low cost using electrochemical processes, at present the electrodeposition of CIGS films is very problematic for several reasons. For example, the electrodeposition of stoichiometric CIGS requires the precise solubility control of all four precursor compounds of Cu, In, Ga and Se, together with the proper controls of the electrochemical potentials for the reduction of these compounds in one single pot, with no undesirable side-products arising from other possible electrochemical reactions in the solution medium. The present inventors have confirmed experimentally that the traditional electrodeposition of CIGS from an aqueous solution is accompanied by both undesirable electrochemical reactions on the electrode prior to the deposition of CIGS and the evolution of hydrogen bubbles at the CIGS film surface during the CIGS deposition.

Nevertheless, several research groups have claimed the electrodeposition of CIGS films with the aqueous solution approach in the literature. For example, Y. P. Fu et al. (Journal of the Electrochemical Society, 2009, 156, 9 E133-E138) reported the electrodeposition of CIGS films in an aqueous solution in the presence of LiCl as a supporting electrolyte. In this publication they disclosed that post-deposition thermal sintering was still required. Furthermore, they could not produce stoichiometric thin films, as the concentration of gallium was observed to be low in the deposited films. Adding more gallium compounds to the aqueous solution was not a viable method to increase the gallium content in the resultant CIGS films because with the increase in the gallium concentration in the aqueous solution, Fu et al. noticed that the gallium reduction potential became more negative which made gallium ion deposition on the electrode more difficult. Another problem with the aqueous solution approach is that molybdenum is commonly used the electrode-contact for CIGS but molybdenum and many other metals oxidize in the aqueous cyclic voltammetry process of CIGS electrodeposition.

Recently Lai et al. (Electrochimica Acta 2009, 54, 3004-3010) reported a one-step electrodeposition process of CIGS film formation in a water-dimethylformamide (DMF) solution. In this case, the co-electrodeposition of the four elements Cu, In, Ga, Se was still difficult due to the huge difference in their reduction potentials in this solution. To overcome this problem, Lai et al. added a complexing agent into the water-DMF bath. In this publication, Lai et al. also elaborated on the aforementioned problem of hydrogen evolution. In essence, Lai et al. were not able to demonstrate the preparation of stoichiometric CIGS films.

In another approach, Kois et al. (Thin Solid Films 2008, 516, 5948-5952) reported the fabrication on CIGS films from thiocyanate complex electrolytes. Once again, they reported the necessity of post-deposition thermal selenization. Their report also shows that their CIGS films were deficient in Ga.

In yet another approach, Long and coworkers (Journal of Physics: Conference Series 2009, 152, 012074) reported the preparation of CIGS films by a one-step electrodeposition in an alcohol solution. Again, a post-deposition thermal sintering process at 550° C. for 30 min was required. Moreover, the report shows that the resultant CIGS films were still observed to be deficient in copper.

A method of electrochemical deposition of CIGS in a non-aqueous solution such as an ionic liquid was recently disclosed by Peter and coworkers ("Electrochemical Deposition of CIGS by Means of Room Temperature Ionic Liquids", Thin Solid Films, 2007, 515, 5899-5903). This publication describes the deposition processes for the preparation of Cu—In—Se and Cu—In—Ga—Se precursor films, which were converted to stoichiometric CIS and CIGS films respectively with a post-deposition thermal selenization at 500° C. for 30 min. The present inventors have repeated the CIGS deposition process disclosed by Peter and coworkers, by following the same bath compositions and applied potential conditions, and found that the disclosed electrodeposition process alone did not produce stoichiometric CIGS films. Typically, the as-deposited CIGS films prepared by the disclosed process have very low selenium content, and show a very poor morphology homogeneity and weak adhesion to molybdenum substrates. The present inventors suspect that this is also the reason for adopting the post-deposition thermal selenization step required by Peter and coworkers to convert their Se-deficient films to stoichiometric CIGS films.

Thus, as discussed above, while there have been recent attempts by many researchers in the field to develop a methodology to electrodeposit CIGS films, there has not been any success in electrodeposition of stoichiometric CIGS films ready for solar cell fabrication with no requirement of post-deposition annealing or selenization.

What is therefore needed is an economical, reproducible electrodeposition method of producing stoichiometric CIGS films which is scalable for use in industries such as production of large surface area solar cells without the requirement of any post-deposition sintering or selenization.

SUMMARY OF THE INVENTION

The present invention provides a production method that uses electrochemistry to generate stoichiometric copper indium gallium diselenium ($CuIn_xGa_{1-x}Se_2$) film. These films can be used in the production of solar cells or other optoelectronic devices when combined with either an n-type inorganic group II-VI or an organic semiconductor films for the production of low-cost and large-area solar cells, with no requirement of either heating above 60-100° C. or post-deposition thermal sintering in all of these electrodeposition processes.

These layers are produced by a low-cost and large-area method of electrochemical deposition in an ionic liquid. Each layer is deposited in one pot with no requirement of either heating above 60-100° C. or post-deposition thermal sintering. Therefore, this invention also enables solar cell production even on polymer-based or other substrates that are not thermally compatible to the common post-deposition thermal sintering of CIGS. The optional addition of a buffer layer with CdS or other compound adjacent to the CIGS layer to improve the solar cell efficiency may be carried out by a chemical bath method or electrodeposition method and is thus compatible with the production design philosophy of low-temperature, low-cost and large-area manufacturing.

The CIGS film produced according to this method matches the emission spectrum of the sun so that the maximum absorption of the solar spectrum by the solar cell can be obtained. Grain sizes of the CIGS are tunable with the specific electrochemical techniques, leading to a highly efficient photoconversion. The present production method is size-scalable because it uses electrolysis controlled by electric current density. These pave the way toward high efficiency for solar energy conversion at very low production cost. Industry applications are very straightforward for functional solar devices.

Thus, an embodiment of the present invention provides a process for forming a thin film of $CuIn_xGa_{1-x}Se_2$ on a conductive substrate, comprising the steps of:

a) forming an ionic liquid composition which comprises an ionic solvent and ionic species of copper, indium, gallium, and selenium;

b) immersing a surface of the conductive substrate into the ionic liquid, immersing a counter electrode into the ionic liquid, electrically connecting the conductive substrate and the counter electrode to a power supply; and c) electrochemically depositing in a one-pot process a film comprised of copper, indium, gallium, and selenium having a stoichiometry $CuIn_xGa_{1-x}Se_2$, with x ranging from about 0.6 to about 0.8.

These $CuIn_xGa_{1-x}Se_2$ films may be used as the basis for producing multilayer structures such as solar cells with suitable electrical contacts contacting the two conductive layers. More generally these films may be used to produce optoelectronic devices.

A further understanding of the functional and advantageous aspects of the invention can be realized by reference to the following detailed description and drawings.

BRIEF DESCRIPTION OF THE DRAWINGS

The embodiments of the present invention are described with reference to the attached figures and table, wherein.

DETAILED DESCRIPTION OF THE INVENTION

Figure 1:
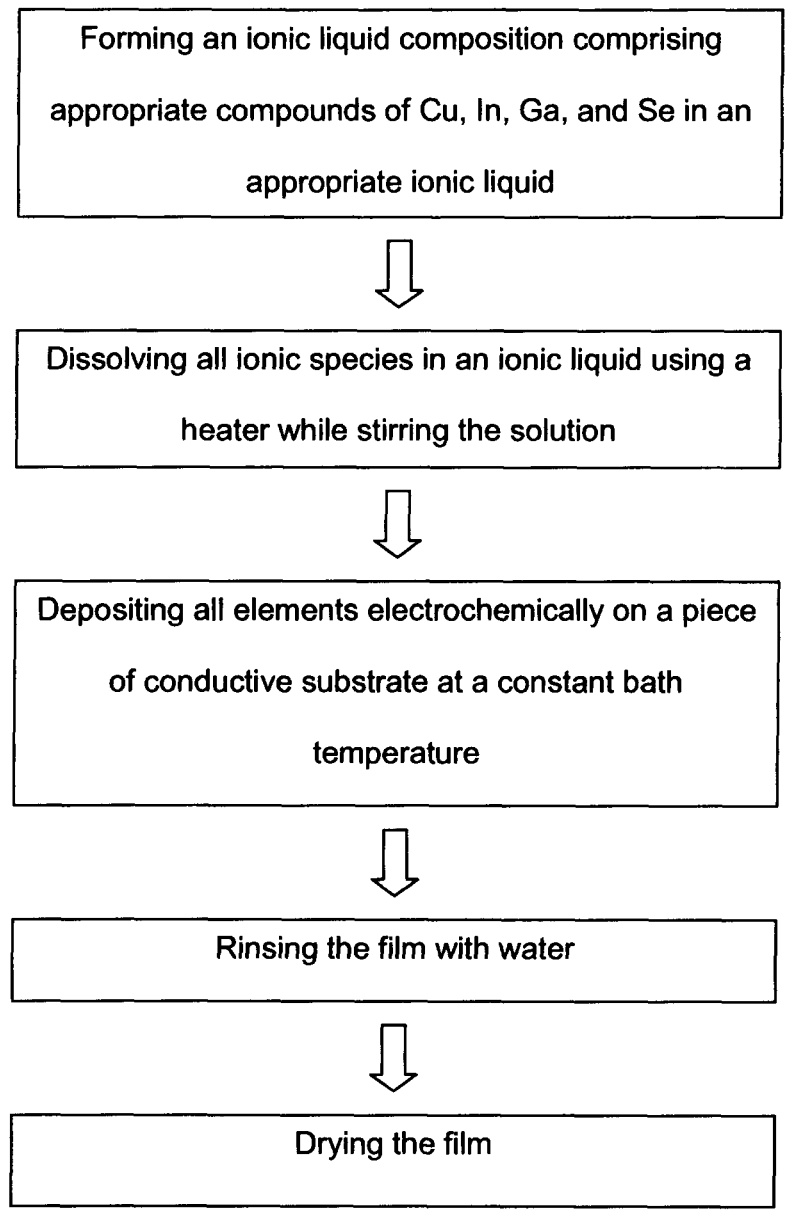
FIG. 1 shows a schematic flow chart of the electrodeposition method according to the present invention.
Figure 2:
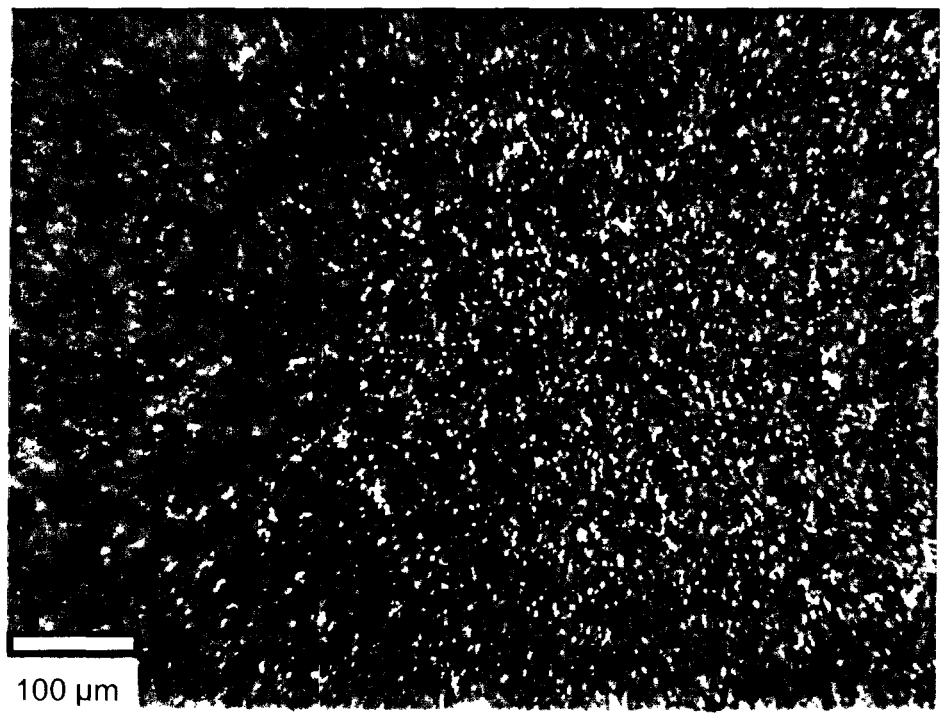
FIG. 2 is an optical image of a CIGS film formed using the method of the present invention onto a molybdenum-coated glass taken by an optical microscope with a 50× lens; and Table 1 summarizes Examples of CIGS film compositions as a function of deposition conditions.

Generally speaking, the systems described herein are directed to electrochemical based methods of producing stoichiometric CIGS films that can be used as absorber layers in solar cells, among other applications. As required, embodiments of the present invention are disclosed herein. However, the disclosed embodiments are merely exemplary, and it should be understood that the invention may be embodied in many various and alternative forms. The figures are not to scale and some features may be exaggerated or minimized to show details of particular elements while related elements may have been eliminated to prevent obscuring novel aspects.

Therefore, specific structural and functional details disclosed herein are not to be interpreted as limiting but merely as a basis for the claims and as a representative basis for teaching one skilled in the art to variously employ the present invention. For purposes of teaching and not limitation, the illustrated embodiments are directed to electrochemical based methods of producing stoichiometric CIGS films for use as absorber layers in solar cells and II-VI semiconductor films for use as n-type semiconductor layers to complete the CIGS solar cell production.

As used herein, the term "about" or "approximately", when used in conjunction with ranges of dimensions, temperatures or other physical properties or characteristics is meant to cover slight variations that may exist in the upper and lower limits of the ranges of dimensions as to not exclude embodiments where on average most of the dimensions are satisfied but where statistically dimensions may exist outside this region. For example, in embodiments of the present invention dimensions of components of an apparatus and method of measuring optical properties of water are given but it will be understood that these are non-limiting.

As used herein, the coordinating conjunction "and/or" is meant to be a selection between a logical disjunction and a logical conjunction of the adjacent words, phrases, or clauses. Specifically, the phrase "X and/or Y" is meant to be interpreted as "one or both of X and Y" wherein X and Y are any word, phrase, or clause.

As used herein, the phrase "one pot" means fabricating stoichiometric CIGS film in one-step, i.e., deposition in one electrochemical bath without any post process such as annealing at high temperature and/or in selenium atmosphere.

According to the invention, alloy constituent species comprising stoichiometric ratio of copper, indium, gallium, and selenium are preferably obtained from an ionic liquid solution of a mixture of compounds comprising copper, indium, gallium, and selenium with the anions being any one of sulfate, acetate, bromide, fluoride, chloride, iodide, hydroxide, nitrate, oxalate, citrate, phosphate, tungstate, hydrates or combinations thereof.

In a preferred embodiment of the invention, the liquid composition is comprised of an ionic liquid mixture of copper (II) chloride, indium (III) chloride, gallium (III) chloride, and selenium (IV) chloride. Stoichiometric CIGS films means film compositions close to $CuIn_xGa_{1-x}Se_2$, with x ranging from 0.6 to 0.8, which is suitable for CIGS films for use in solar cell production.

Preferably, the atomic concentrations in the ionic liquid are from about 5 mM to about 10 mM for copper, from about 40 mM to about 60 mM for indium, from about 40 mM to about 60 mM for gallium, and from about 60 mM to about 80 mM for selenium. More preferably the atomic concentrations are from about 6 mM to about 8 mM for copper, from about 40 mM to about 50 mM for indium, from about 40 mM to about 50 mM for gallium, and from about 65 mM to about 75 mM for selenium.

We have found that it is possible to use different electrochemical methods such as cyclic voltammetry, constant potential, or constant current to make stoichiometric CIGS films suitable for solar cell production. Between these various electrochemical methods, cyclic voltammetry typically gives superior film morphology because after the potential sweep for film deposition, the other half-cycle can be engineered to etch off any undesirable heterogeneous growth features at the growth front. However, in some applications the constant current method of production may be preferred based on its faster deposition rate.

In the present invention, it is preferable to use the cyclic voltammetry technique with the potential from about −0.2 V to about −2.2V, while it is more preferable to carry out cyclic voltammetry in the potential range from about −0.1 V to about −2.0 V. When the constant potential method is used, it is preferable to use a constant potential more negative than −1.30 V applied to the working electrode on which the CIGS film is being deposited, and it is more preferable to use a constant potential of about −1.35 V. In the constant potential mode for electrodeposition the potential may be held in a range from about −1.30 V to about −1.60 V. Thus, in the constant potential mode, a constant potential is applied to the conductive substrate (which serves as one electrode) and the counter electrode such that the voltage on the conductive substrate is more negative than −1.30 V, and it is more preferable to use −1.35 V.

In constant current mode, it is preferred to use current density more than −1.2 mA/cm$^2$, more preferably between −1.2 mA/cm$^2$ and −4.2 mA/cm$^2$.

It will be appreciated that the CIGS films may be deposited onto numerous types of substrates such as metallic substrates including but not limited to molybdenum, aluminum, copper, platinum, conductive oxides including but not limited to indium-tin-oxide-coated-glass, indium-tin-oxide-coated-polymer, other conductor-coated-insulators, electrically conductive polymers. More particularly, the substrate may comprise conductive polymer, polymer coated by metal, polymer coated with a transparent and conductive layer, ITO on glass, ITO on polymer, ceramic coated with a conductive layer, metal, amorphous semiconductor materials, crystalline semiconductor materials, polycrystalline semiconductor materials, or combinations thereof.

Any ionic liquid may be used as the solvent; however, it is preferable to use reline, which is a mixture of urea and choline chloride, as the solvent. It will be appreciated by those skilled in the art that numerous other ionic solvents such as any imidazolium- and pyridinium-based ionic liquids may be used.

In order to achieve electrodeposition, the solution is heated to a temperature which preferably ranges from 50° C. to about 100° C., more preferably from about 55° C. to about 85° C., and most preferably from about 60° C. to about 75° C. In all cases, the bath temperature should be kept constant during the deposition. For example, this can be achieved with a circulating water bath. The reactions may be carried out in a thermal-jacketed glass beaker with four Teflon stoppers with an appropriate amount of solution in a small batch approach. In production, a large bath can be used.

Thus, during electrochemical deposition the ionic liquid may heated to a temperature which is in a range from about 50° C. to about 100° C. and is held substantially constant while the $CuIn_xGa_{1-x}Se_2$ film is electrodeposited onto the conductive substrate.

The composition, grain size, thickness, morphology, and electrical properties of the resultant CIGS films are influenced by the deposition conditions which include (a) proper bath compositions with the four cations of CIGS and proper choices of anions, (b) proper choice of ion liquid; (c) proper bath temperature; (d) proper choice of the substrate electrode and the pre-deposition treatment of the electrode; (e) proper agitation of the bath prior to the deposition and during deposition; (f) proper conditions of applying and sweeping the potential; (g) proper deposition time; and (h) proper ending of the deposition process. The present invention describes the method of one-pot process of depositing stoichiometric CIGS with grain and electrical properties adequate for solar cell production without the requirement of post-deposition thermal sintering.

In summary, the present invention is different from the methods using the aqueous solution approach to deposit CIGS films. In embodiments of the present invention, precursor compounds comprising chlorides of Cu, Ga, In, and Se are dissolved in an ionic liquid solution. The metal cations of the Cu, Ga, In, and Se are then electrochemically reduced on a molybdenum electrode and the stoichiometric CIGS semiconductor alloy is formed at the electrode.

Four examples are shown in Table 1 to show the dependence of film compositions on the conditions of the one-pot ionic-liquid electrodeposition method. Among these four examples, both Samples #2-3 have their Se/Cu ratio close to that of a stoichiometric CIGS film suitable for the production of solar cells. In the course of the development of the present invention, the inventors have also explored the aqueous solution approach as a comparative analysis. However, it has been observed that bath compositions depend on electrodeposition methods and we were required to adjust it with each method. In addition, the inventors considered the ratio of In/In+Ga and Cu/In+Ga in making stoichiometric CIGS films. It was found that in the aqueous solution approach, the deposition efficiencies of In and Ga are limited by the electro-reduction of $H^+$ in the aqueous solution. In other words, the electrochemical reduction of the cations of In, Ga and H are competing in the reduction cycle. In addition, the formation of hydrogen bubbles during CIGS film deposition also causes undesirable compositional inhomogeneity, surface morphology and film defects (including pinholes).

The choline chloride/urea eutectic is an appropriate ionic liquid to prevent these technical problems inherent in the aqueous solution deposition method because it is stable in air and moisture, and the operational temperature is conveniently moderate and compatible even with polymers and other heat-sensitive substrates.

The present method for the electrodeposition of CIGS is different from the method of L. M. Peter and coworkers (in the publication entitled "Electrochemical Deposition of CIGS by Means of Room Temperature Ionic Liquids", Thin Solid Films, 515, 5899-5903 (2007)) in the following ways:

(a) Peter and coworkers were not able to make stoichiometric CIGS films using their electrochemical deposition method alone. They used selenization at 500° C. for 30 minutes to form their stoichiometric CIGS films. In comparison, the present invention uses a one-pot electrochemical deposition to make stoichiometric CIGS films with no requirement of post-deposition thermal sintering.

(b) The CIGS growth conditions according to the present invention are very much different from those used by Peter and coworkers. In the method of Peter and coworkers, the selenium concentration in the bath was merely 10mM and when their deposition condition was followed. The present inventors found CIGS deposits with $Cu(In, Ga)Se_{0.02}$. such that Se was far off its proper concentration in the stoichiometric $Cu(In,Ga)Se_2$.

(c) The method of Peter and coworkers only teaches the constant potential approach of CIGS deposition, whereas the present invention disclsoses both the constant potential cyclic voltammetry and constant current approaches can be used. Typically, the cyclic voltammetry method gives better film morphology than the constant voltage approach. On the other hand, the constant current deposition method favors shorter deposition times, which is desirable in industry.

The present invention also teaches the completion of CIGS solar cell production with each of the p-type CIGS and n-type II-VI or organic semiconductor layers deposited by one-pot ionic-liquid electrodeposition. For the production of solar cells with a buffer layer such as CdS or other compounds adjacent to the CIGS layer to improve the solar cell efficiency, the buffer layer is deposited either by a chemical bath method or an electrodeposition method so that the process is compatible with the electrodeposition of p-CIGS and n-II-VI layers. In some embodiments, after the one-pot ionic-liquid electrodeposition of CIGS on a Mo electrode, ZnO is subsequently deposited also with ionic-liquid electrodeposition. In one embodiment, stoichiometric CdS is deposited with the chemical bath method with aqueous solutions of 0.45M cadmium sulfate, 0.15M thiourea, and 1.8M ammonium at temperatures in a range from about 50° C. to about 80° C.

In some embodiments ZnO is deposited with zinc compounds of acetate, perchlorate, or any other zinc salts. In one embodiment, ZnO is deposited with 0.1 M in reline ionic liquid at 90° C. and a constant potential of −1.5 V. In another embodiment, the cyclic voltammetry with the potential sweep from −0.2 to −2.2 V is used. In some embodiments, both CdS and ZnO are deposited with a bath temperature of 65° C.

The present invention is very advantageous for several reasons. First, the present method can be used to produce stoichiometric CIGS films suitable for the low-cost and high-throughput production of solar cells on large surface areas. The electrodeposition can be easily scaled up with a deposition area >30 m$^2$ with a large bath, and with the option of automatic feeding of a roll of substrates from one bath to the next bath for sequential electrodeposition such as the sequential electrodeposition of CIGS/CdS/ZnO or ZnO/CdS/CIGS. The capital investment and equipment operating costs of electrodeposition are also much less than those relying on vacuum technology for deposition or post-deposition treatments. Some of the electrodeposition processes can also be replaced by simple chemical-bath processes which are low-cost, scalable, and compatible with electrodeposition processes.

The present method also allows one to flexibly tune the grain size for high photo-conversion that results in high conversion efficiency of the solar cell. The present method thus eliminates the need for any post-deposition thermal sintering. Most importantly, since the deposition temperature is typically well below 100° C., the present invention enables the production of CIGS solar cells on polymer and other heat-sensitive substrates.

The method disclosed herein will now be exemplified by the following non-limiting examples that are meant to illustrate and not limit the method.

EXAMPLE 1

This example involves electrochemical deposition of copper, indium, and selenium (CIS) on a substrate which can be any conductive or semiconductive material such as conductive polymers, metals (sheet), or deposited metals (such as but not limited to gold, molybdenum, calcium, vanadium, chromium, silver, cobalt, iron, palladium, aluminum) deposited on a piece of glass or plastic or something similar. The conditions of this deposition were: [$CuCl_2$]=7.5 mM, [$InCl_3$]=65 mM, and [$SeCl_4$]=40 mM at 65° C. in an ionic liquid at a constant potential of −1.35 V. It is also possible to make CIS film using other electrochemical techniques such as cyclic voltammetry.

While this Example 1 involved deposition of CIS and not CIGS, the confirmation of the production of stoichiometric CIS films by the present invention is important because it is the prerequisite of the production of CIGS films. In addition, CIS can also be used as a practical absorbing layer in solar cells.

EXAMPLE 2

This example involves electrochemical deposition of CIGS on ITO glass using an ionic liquid as a solvent where the following concentrations were used: [$CuCl_2$]=7.5 mM, [$InCl_3$]=55 mM, [$GaCl_3$]=45 mM, [$SeCl_4$]=60 mM. The process was under constant temperature at 65 ° C. for 150 minutes. Cyclic voltammetry was used with the potential range between −0.1 V and −2.0 V being applied to do the deposition. However, it is possible to do the stoichiometric deposition using other electrochemical techniques such as, but not limited to, applying a constant potential such as was done in Example 1. Some examples of film compositions are shown in Table 1. Samples 1-3, particularly Samples 2-3, have film compositions of Se/Cu very close to the ideal stoichiometric CIGS composition for solar cell production. Hence, the deposition conditions of them can be fine-tuned for the actual solar cell production requirements.

EXAMPLE 3

The method disclosed herein also provides a method for the fabrication of a solar cell using the CIGS film described in Example 2. After depositing CIGS film, the edges of the CIGS film were covered, and CdS and ZnO were electrodeposited in reline at 90° C. For CdS, the deposition was carried out with aqueous solutions of 0.45M cadmium sulfate, 0.15M thiourea, and 1.8M ammonium at 80° C. in a simple chemical bath. For ZnO, 0.1 M of zinc perchlorite and a constant potential of −1.5V was used. Then, ITO was deposited on zinc oxide film to complete the solar cell fabrication.

EXAMPLE 4

The method disclosed herein involves the fabrication of a solar cell with the procedures and conditions similar to Example 3 except that the procedures comprise (a) ITO was deposited on a glass substrate, (b) ZnO was electrodeposited on ITO, (c) CdS was electrodeposited on ZnO, (d) CIGS was electrodeposited on CdS, and (e) a metal electrode was painted or electro-deposited on CIGS.

TABLE 1

Examples of controlling film compositions of the one-pot electrodeposited CIGS films

| | Bath Composition | | | | | |
|---|---|---|---|---|---|---|
| Sample # | [Cu] | [In] | [Ga] | [Se] | Film Composition | Ga/(Ga + In) of the film |
| 1 | 7.5 | 55 | 50 | 60 | $Cu_{1.0}(In_{0.69}, Ga_{0.31})Se_{1.85}$ | 0.31 |
| 2 | 7.5 | 55 | 45 | 60 | $Cu_{1.0}(In_{0.76}, Ga_{0.24})Se_{1.92}$ | 0.24 |
| 3 | 7.5 | 45 | 45 | 65 | $Cu_{1.0}(In_{0.54}, Ga_{0.46})Se_{2.6}$ | 0.46 |
| 4* | 7.0 | 50 | 60 | 10 | $Cu_{1.0}(In_{0.60}, Ga_{0.40})Se_{0.02}$ | 0.40 |

[ ] = mM in the bath composition
*Done under a constant potential of −1.3 V and the same condition as reported by L. M. Peter and coworkers (Thin Solid Films 515 (2007) 5899-5903).

For Samples #1-3, the choline chloride/urea eutectic was used as the ionic liquid. The solution was formed by vigorous stirring until a clear solution was formed but it was not stirred during deposition. The bath temperature was set at 65° C. and cyclic voltammetry from −0.1 V to −2.0 V (versus a Pt electrode) with a 20 mV/sec scanning rate was applied. The Mo electrode was pre-etched and rinsed thoroughly prior to the deposition.

The results in Table 1 confirm that the methods of the present invention can produce CIGS films with a ratio of selenium/copper close to 2.0, which is a technological breakthrough as this has never been accomplished.

The present invention is useful for producing multilayer structures which involves depositing a layer of $CuIn_xGa_{1-x}Se_2$ on a conductive substrate with x ranging from 0.6 to 0.8, depositing at least one n-type semiconductor layer on the $CuIn_xGa_{1-x}Se_2$ layer, and depositing a top electrode on the n-type semiconductor layer to form the multilayer structure.

Alternatively, a layered structure could be produced by depositing at least one n-type semiconductor layer on a conductive substrate followed by depositing a layer of $CuIn_xGa_{1-x}Se_2$ on the at least one n-type semiconductor layer with x ranging from 0.6 to 0.8, and thereafter depositing a top electrode on the $CuIn_xGa_{1-x}Se_2$ layer to form the multilayer structure.

The at least one n-type semiconductor may be an n-type inorganic semiconductor or an n-type organic semiconductor. In a preferred embodiment the n-type inorganic semiconductor layer comprises a stoichiometric ZnO layer. However it will be appreciated that the n-type inorganic semiconductor layer may comprise a stoichiometric II-VI semiconductor layer.

The organic semiconductor may be ITO coated polymer or plastic (such as polyethylene terephthalate), or fluorine doped ITO deposited on polymer or plastic such as PET. The ITO coated on polymer or plastic is forms the back contact for solar cell. As the last step, a front contact is added to complete the solar cell or optoelectronic device. One of back contact or front contact should be transparent to let the light pass through the layers of the device.

ITO coated on a polymer such as PET may be used as a back contact onto which is initially deposited an n-type organic/inorganic semiconductor as the first layer. A non-limiting example of n-type organic semiconductor is for [6,6]-phenyl-$C_{61}$-butyric acid methyl ester (PCBM) which we used for production of a hybrid (n-type organic -p-type inorganic semiconductor) solar cell.

Other examples of n-type semiconductors that we can be used include:
[6,6]-Phenyl $C_{61}$ butyric acid methyl ester
[6,6]-Phenyl $C_{71}$ butyric acid methyl ester
[6,6]-Phenyl-$C_{61}$ butyric acid butyl ester
[6,6]-Phenyl-$C_{61}$ butyric acid octyl ester
[6,6]-Thienyl $C_{61}$ butyric acid methyl ester
[6,6]-Pentadeuterophenyl $C_{61}$ butyric acid methyl ester
Other examples of organic semiconductors includes derivatives of fullerene, rylene diimides, derivatives of thiophene, and any combination thereof.

The $CuIn_xGa_{1-x}Se_2$ layer may have a thickness in a range from about 100 nm to about 5000 nm but is not restricted to this range.

The layered structure may include a buffer layer between the $CuIn_xGa_{1-x}Se_2$ layer and the ZnO layer, and this buffer layer may comprise cadmium sulphide (CdS) or indium selenide ($In_2Se_3$). This optional addition of a CdS buffer layer or similar materials adjacent to the CIGS layer acts to improve the solar cell efficiency and can be carried out by a chemical-bath or electrodeposition method which is compatible with this production design philosophy of low-cost, large-area, and low-temperature manufacturing.

The conductive substrate comprises any one of a conductive polymer, polymer coated by metal, polymer coated with a transparent and conductive layer, ITO on glass, ITO on polymer, ceramic coated with a conductive layer, metal, amorphous semiconductor materials, crystalline semiconductor materials, polycrystalline semiconductor materials, or combinations thereof.

The multilayer structure may be a solar cell with suitable electrical contacts contacting the two conductive layers. More generally the multilayer structure may be an optoelectronic device.

Advantageously all the layers can be deposited in a sequence of one-pot bath based processes. The present invention provides a method of electrodeposition of semiconductor layers needed to complete the CIGS solar cell production with a roll-to-roll substrate feeding mechanism through a sequence of electrochemical baths.

The present invention is the first demonstration of the production of CIGS solar cells with the procedures to form the inverted structure of metal-electrode/p-CIGS/n-II-VI-layers/transparent-electrode/transparent-substrate in addition to the normal structure of electrode/n-II-VI-layers/p-CIGS/metal-electrode/substrate.

As used herein, the terms, "comprises" and "comprising" are to be construed as being inclusive and open ended, and not exclusive. Specifically, when used in this specification including claims, the terms, "comprises" and "comprising" and variations thereof mean the specified features, steps or components are included. These terms are not to be interpreted to exclude the presence of other features, steps or components.

The foregoing description of the preferred embodiments of the invention has been presented to illustrate the principles of the invention and not to limit the invention to the particular embodiment illustrated. It is intended that the scope of the invention be defined by all of the embodiments encompassed within the following claims and their equivalents.

Therefore what is claimed is:

1. A process for forming a thin, stoichiometric semiconductor film of $CuIn_xGa_{1-x}Se_2$ on a conductive substrate, comprising:
   a) forming an ionic liquid composition which comprises an ionic solvent and ionic species of copper, indium, gallium, and selenium;
   b) immersing a surface of the conductive substrate into the ionic liquid, immersing a counter electrode into the ionic liquid, electrically connecting the conductive substrate and the counter electrode to a power supply; and
   c) electrochemically depositing in a one-pot process a film comprised of copper, indium, gallium, and selenium having a stoichiometry of $CuIn_xGa_{1-x}Se_2$, with x ranging from about 0.6 to about 0.8, the step of electrochemical deposition includes applying a potential more negative than about −1.30V to about −1.60V to the conductive substrate.

2. The process of claim 1 wherein said ionic solvent is Reline.

3. The process of claim 1 wherein said ionic solvent is selected from the group consisting of imidazolium-based ionic liquids and pyridinium-based ionic liquids.

4. The process of claim 1 wherein said step of electrochemically depositing a film of $CuIn_xGa_{1-x}Se_2$ includes electrochemically depositing the film using any one of constant voltage deposition, and cyclic voltammetry.

5. The process of claim 4 wherein the film is deposited using cyclic voltammetry, and wherein an applied voltage is scanned in cycles from a potential about −0.2 V to about −2.2 V such that said potential being more negative than about −1.30V to about −1.60V is applied to said conductive electrode during part of a cyclic voltammetry scan.

6. The process of claim 5 wherein a concentration of the copper ionic species component of the ionic liquid composition ranges from about 5 millimol per liter to about 10 millimol per liter, and wherein a concentration of the gallium ionic species component of the ionic liquid composition ranges from about 40 millimol per liter to about 60 millimol per liter, and wherein the concentration of the indium ionic species component of the ionic liquid composition ranges from about 40 millimol per liter to about 60 millimol per liter, and wherein the concentration of selenium ionic species component of the ionic liquid composition ranges from about 60 millimol per liter to about 80 millimol per liter.

7. The process of claim 1 wherein a concentration of the copper ionic species component of the ionic liquid composition ranges from about 5 millimol per liter to about 10 millimol per liter, and wherein a concentration of the gallium ionic species component of the ionic liquid composition ranges from about 40 millimol per liter to about 60 millimol per liter, and wherein the concentration of the indium ionic species component of the ionic liquid composition ranges from about 60 millimol per liter to about 90 millimol per liter, and wherein the concentration of selenium ionic species component of the ionic liquid composition ranges from about 40 millimol per liter to about 80 millimol per liter.

8. The process of claim 4 wherein the film is deposited using constant voltage deposition in which a constant potential applied to the conductive substrate which in a range from about −1.30 V to −1.60 V.

9. The process of claim 8 wherein a concentration of the copper ionic species component of the ionic liquid composition ranges from about 5 millimol per liter to about 10 millimol per liter, and wherein a concentration of the gallium ionic species component of the ionic liquid composition ranges from about 40 millimol per liter to about 50 millimol per liter, and wherein the concentration of the indium ionic species component of the ionic liquid composition ranges from about 40 millimol per liter to about 60 millimol per liter, and wherein the concentration of selenium ionic species component of the ionic liquid composition ranges from about 40 millimol per liter to about 70 millimol per liter.

10. The process of claim 1 wherein the copper ionic species is obtained from an ionic liquid solution of copper sulfate, acetate, bromide, fluoride, chloride, iodide, hydroxide, nitrate, oxalate, citrate, phosphate, tungstate, hydrates or combinations thereof.

11. The process of claim 1 wherein the gallium ionic species is obtained from an ionic liquid solution of gallium sulfate, acetate, bromide, fluoride, chloride, iodide, hydroxide, nitrate, oxalate, citrate, phosphate, tungstate, hydrates or combinations thereof.

12. The process of claim 1 wherein the indium ionic species is obtained from an ionic liquid solution of indium sulfate, acetate, bromide, fluoride, chloride, iodide, hydroxide, nitrate, oxalate, citrate, phosphate, tungstate, hydrates or combinations thereof.

13. The process of claim 1 wherein the selenium ionic species is obtained from an ionic liquid solution of selenium sulfate, acetate, bromide, fluoride, chloride, iodide, hydroxide, nitrate, oxalate, citrate, phosphate, tungstate, hydrates or combinations thereof.

14. The process of claim 1 wherein the substrate comprises conductive polymer, polymer coated by metal, polymer coated with a transparent and conductive layer, ITO on glass, ITO on polymer, ceramic coated with a conductive layer, metal, amorphous semiconductor materials, crystalline semiconductor materials, polycrystalline semiconductor materials, or combinations thereof.

15. The process of claim 1 wherein during electrochemical deposition the ionic liquid is heated to a temperature which is in a range from about 50° C. to about 100° C. and is held substantially constant while the $CuIn_xGa_{1-x}Se_2$ film is electrodeposited onto the conductive substrate.

16. A process for forming a multilayer structure, the process comprising:
a) depositing a layer of $CuIn_xGa_{1-x}Se_2$ on a conductive substrate with x ranging from 0.6 to 0.8 using the process of claim 1;
b) depositing at least one n-type semiconductor layer on the $CuIn_xGa_{1-x}Se_2$ layer; and
c) depositing a top electrode on the at least one n-type semiconductor layer to form the multilayer structure.

17. A process for forming a multilayer structure, the process comprising:
a) depositing at least one n-type semiconductor layer on a conductive substrate;
b) depositing a layer of $CuIn_xGa_{1-x}Se_2$ on the at least one n-type semiconductor layer with x ranging from 0.6 to 0.8 using the process of claim 1; and
c) depositing a top electrode on the $CuIn_xGa_{1-x}Se_2$ layer to form the multilayer structure.

18. The process of claim 16 wherein said at least one n-type semiconductor layer is one of an n-type inorganic semiconductor layer and an n-type organic semiconductor layer.

19. The process of claim 18 wherein said organic semiconductor layer is selected from the group consisting of phenyl-$C_{61}$-butyric-acid-methyl ester, derivatives of fullerene, rylene diimides, derivatives of thiophene, and any combination thereof.

20. The process of claim 18 wherein the n-type inorganic semiconductor layer comprises a stoichiometric ZnO layer.

21. The process of claim 18 wherein the n-type inorganic semiconductor layer comprises a stoichiometric II-VI semiconductor layer.

22. The process of claim 20 further comprising a buffer layer between the $CuIn_xGa_{1-x}Se_2$ layer and the ZnO layer, said buffer layer comprising any one of cadmium sulphide (CdS) and indium selenide ($In_2Se_3$).

23. The process of claim 22 wherein the $CuIn_xGa_{1-x}Se_2$, ZnO and cadmium sulphide (CdS) or indium selenide ($In_2Se_3$) are deposited in a sequence of one-pot bath based processes.

24. The process of claim 16 wherein the $CuIn_xGa_{1-x}Se_2$ layer has a thickness in a range from about 100 nm to about 5000 nm.

25. The process of claim 16 wherein the conductive substrate comprises any one of a conductive polymer, polymer coated by metal, polymer coated with a transparent and conductive layer, ITO on glass, ITO on polymer, ceramic coated with a conductive layer, metal, amorphous semiconductor materials, crystalline semiconductor materials, polycrystalline semiconductor materials, or combinations thereof.

26. The process of claim 16 wherein said conductive substrate is selected from the group consisting of indium tin oxide coated polymer or plastic and fluorine doped indium tin oxide coated polymer or plastic.

27. The process of claim 26 wherein said polymer is polyethylene terephthalate.

28. The process of claim 16 wherein all the layers are deposited in a sequence of one-pot bath based processes.

29. The process of claim 17 wherein said at least one n-type semiconductor layer is one of an n-type inorganic semiconductor layer and an n-type organic semiconductor layer.

30. The process of claim 29 wherein said organic semiconductor layer is selected from the group consisting of phenyl-$C_{61}$-butyric-acid-methyl ester, derivatives of fullerene, rylene diimides, derivatives of thiophene, and any combination thereof.

31. The process of claim 29 wherein the n-type inorganic semiconductor layer comprises a stoichiometric ZnO layer.

32. The process of claim 29 wherein the n-type inorganic semiconductor layer comprises a stoichiometric II-VI semiconductor layer.

33. The process of claim 32 further comprising a buffer layer between the $CuIn_xGa_{1-x}Se_2$ layer and the ZnO layer, said buffer layer comprising any one of cadmium sulphide (CdS) and indium selenide ($In_2Se_3$).

34. The process of claim 33 wherein the $CuIn_xGa_{1-x}Se_2$, ZnO and cadmium sulphide (CdS) or indium selenide ($In_2Se_3$) are deposited in a sequence of one-pot bath based processes.

35. The process of claim 17 wherein the $CuIn_xGa_{1-x}Se_2$ layer has a thickness in a range from about 100 nm to about 5000 nm.

36. The process of claim 17 wherein the conductive substrate comprises any one of a conductive polymer, polymer coated by metal, polymer coated with a transparent and conductive layer, ITO on glass, ITO on polymer, ceramic coated with a conductive layer, metal, amorphous semiconductor materials, crystalline semiconductor materials, polycrystalline semiconductor materials, or combinations thereof.

37. The process of claim 17 wherein said conductive substrate is selected from the group consisting of indium tin oxide coated polymer or plastic and fluorine doped indium tin oxide coated polymer or plastic.

38. The process of claim 37 wherein said polymer is polyethylene terephthalate.

39. The process of claim 17 wherein all the layers are deposited in a sequence of one-pot bath based processes.

40. A process for forming a thin semiconductor film of $CuIn_xGa_{1-x}Se_2$ on a conductive substrate, comprising the steps of:
   a) forming an ionic liquid composition which comprises an ionic solvent and ionic species of copper, indium, gallium, and selenium;
   b) immersing a surface of the conductive substrate into the ionic liquid, immersing a counter electrode into the ionic liquid, electrically connecting the conductive substrate and the counter electrode to a power supply; and
   c) using constant voltage deposition in which a constant potential in a range from more negative than about −1.30V to about −1.60 V is applied to the conductive substrate for electrochemically depositing in a one-pot process a film comprised of copper, indium, gallium, and selenium having a stoichiometry $CuIn_xGa_{1-x}Se_2$, with x ranging from about 0.6 to about 0.8.

41. A process for forming a thin semiconductor film of $CuIn_xGa_{1-x}Se_2$ on a conductive substrate, comprising the steps of:
   a) forming an ionic liquid composition which comprises an ionic solvent and ionic species of copper, indium, gallium, and selenium;
   b) immersing a surface of the conductive substrate into the ionic liquid, immersing a counter electrode into the ionic liquid, electrically connecting the conductive substrate and the counter electrode to a power supply; and
   c) using cyclic voltammetry for electrochemically depositing in a one-pot process a film comprised of copper, indium, gallium, and selenium having a stoichiometry $CuIn_xGa_{1-x}Se_2$, with x ranging from about 0.6 to about 0.8, and wherein an applied voltage is scanned in cycles from a potential about −0.2 V to about −2.2 V.

42. A process for forming a thin semiconductor film of $CuIn_xGa_{1-x}Se_2$ on a conductive substrate, comprising the steps of:
   a) forming an ionic liquid composition which comprises an ionic solvent and ionic species of copper, indium, gallium, and selenium;
   b) immersing a surface of the conductive substrate into the ionic liquid, immersing a counter electrode into the ionic liquid, electrically connecting the conductive substrate and the counter electrode to a power supply; and
   c) applying a scanning potential for electrochemically depositing in a one-pot process a film comprised of copper, indium, gallium, and selenium having a stoichiometry $CuIn_xGa_{1-x}Se_2$, with x ranging from about 0.6 to about 0.8, and wherein the scanning potential ranges from about −0.2 V to about −2.2 V.

* * * * *